US010663502B2

(12) United States Patent
Erickson et al.

(10) Patent No.: US 10,663,502 B2
(45) Date of Patent: May 26, 2020

(54) REAL TIME COGNITIVE MONITORING OF CORRELATIONS BETWEEN VARIABLES

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); George F. Paulik, Rochester, MN (US); Raymond A. Richetta, Rochester, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 15/612,433

(22) Filed: Jun. 2, 2017

(65) Prior Publication Data
US 2018/0348272 A1 Dec. 6, 2018

(51) Int. Cl.
*G01R 27/26* (2006.01)
*G01R 29/24* (2006.01)
*G06F 7/02* (2006.01)
*G06F 7/00* (2006.01)

(52) U.S. Cl.
CPC ......... *G01R 27/2605* (2013.01); *G01R 29/24* (2013.01); *G06F 7/00* (2013.01); *G06F 7/02* (2013.01); *G06F 2207/4802* (2013.01)

(58) Field of Classification Search
None
See application file for complete search history.

(56) References Cited

U.S. PATENT DOCUMENTS

| 3,076,933 | A | 2/1963 | Negrete |
| 4,561,089 | A | 12/1985 | Rouse et al. |
| 4,800,518 | A | 1/1989 | Miller |

(Continued)

OTHER PUBLICATIONS

U.S. Appl. No. 15/437,482, to Karl R. Erickson et al., entitled, *Predicting Data Correlation Using Multivalued Logical Outputs in Static Random Access Memory (SRAM) Storage Cells*, assigned to International Business Machines Corporation, 29 pages, filed Feb. 21, 2017.

(Continued)

*Primary Examiner* — David M. Gray
*Assistant Examiner* — Geoffrey T Evans
(74) *Attorney, Agent, or Firm* — Nathan M. Rau

(57) ABSTRACT

Real time cognitive monitoring of correlations between variables including receiving, by a circuit, a first set of data results and a second set of data results, wherein each set of data results comprises binary data points; adding a unit of charge to a collection capacitor on the circuit for each of the first set of data results that indicates a positive data point; removing a unit of charge from the collection capacitor for each of the second set of data results that indicates a positive data point; and triggering a first sense amp on the circuit if the charge on the collection capacitor exceeds a high charge threshold, indicating that the positive data points in the first set of data results is greater than the positive data points in the second set of data results to a first statistical significance.

13 Claims, 7 Drawing Sheets

(56) References Cited

U.S. PATENT DOCUMENTS

| | | | |
|---|---|---|---|
| 4,802,103 | A | 1/1989 | Faggin et al. |
| 4,896,156 | A * | 1/1990 | Garverick ............ G06G 7/1865 332/106 |
| 5,376,915 | A | 12/1994 | Takeuchi et al. |
| 5,497,121 | A | 3/1996 | D'Hont |
| 5,768,501 | A | 6/1998 | Lewis |
| 6,081,468 | A | 6/2000 | Taira et al. |
| 6,130,568 | A | 10/2000 | Kwon et al. |
| 6,154,864 | A | 11/2000 | Merritt |
| 6,982,431 | B2 | 1/2006 | Modlin et al. |
| 7,084,695 | B2 | 8/2006 | Porter |
| 7,111,260 | B2 | 9/2006 | Visweswariah |
| 7,139,743 | B2 | 11/2006 | Indeck et al. |
| 8,909,592 | B2 | 12/2014 | Stergiou et al. |
| 9,000,837 | B1 | 4/2015 | Fifield |
| 9,082,495 | B2 | 7/2015 | Lee et al. |
| 9,093,175 | B2 | 7/2015 | Barth, Jr. et al. |
| 9,147,144 | B2 | 9/2015 | Potyrailo et al. |
| 9,147,457 | B2 | 9/2015 | Kim et al. |
| 9,367,853 | B2 | 6/2016 | Cronin et al. |
| 9,411,009 | B1 | 8/2016 | Aguayo Gonzalez et al. |
| 9,478,303 | B1 | 10/2016 | Parker |
| 9,508,424 | B2 | 11/2016 | Lee |
| 9,916,538 | B2 | 3/2018 | Zadeh et al. |
| 9,916,890 | B1 | 3/2018 | Erickson et al. |
| 10,037,792 | B1 | 7/2018 | Erickson et al. |
| 10,043,568 | B1 | 8/2018 | Erickson et al. |
| 10,304,522 | B2 | 5/2019 | Erickson et al. |
| 10,418,094 | B2 | 9/2019 | Erickson et al. |
| 2002/0159319 | A1 | 10/2002 | Kirihata et al. |
| 2003/0090706 | A1 | 5/2003 | Rijavec |
| 2006/0062483 | A1 * | 3/2006 | Kondo ................. G11C 7/1006 382/253 |
| 2007/0070754 | A1 | 3/2007 | Vogelsang |
| 2008/0313510 | A1 | 12/2008 | Baker |
| 2010/0182859 | A1 | 7/2010 | Kohler et al. |
| 2013/0090706 | A1 | 4/2013 | Nudo |
| 2014/0063915 | A1 | 3/2014 | Cronie et al. |
| 2014/0122925 | A1 | 5/2014 | Peake et al. |
| 2014/0160832 | A1 * | 6/2014 | Ito ......................... G11C 7/067 365/148 |
| 2014/0201426 | A1 | 7/2014 | Ma |
| 2014/0293715 | A1 | 10/2014 | Barth, Jr. et al. |
| 2015/0016193 | A1 | 1/2015 | Lewis et al. |
| 2015/0281612 | A1 | 10/2015 | Lund et al. |
| 2015/0358090 | A1 * | 12/2015 | Mactaggart ........ G01R 31/3171 375/224 |
| 2017/0220918 | A1 | 8/2017 | Entner |
| 2018/0218766 | A1 | 8/2018 | Erickson et al. |
| 2018/0240512 | A1 | 8/2018 | Erickson et al. |
| 2018/0348271 | A1 | 12/2018 | Erickson et al. |
| 2018/0348273 | A1 | 12/2018 | Erickson et al. |
| 2018/0348274 | A1 | 12/2018 | Erickson et al. |
| 2018/0349774 | A1 | 12/2018 | Erickson et al. |
| 2018/0349775 | A1 | 12/2018 | Erickson et al. |
| 2018/0350422 | A1 | 12/2018 | Erickson et al. |
| 2018/0350423 | A1 | 12/2018 | Erickson et al. |

OTHER PUBLICATIONS

U.S. Appl. No. 15/420,679, to to Karl R. Erickson et al., entitled, *Big Data Analysis Using Low Power Circuit Design*, assigned to International Business Machines Corporation, 31 pages, filed Jan. 31, 2017.

U.S. Appl. No. 15/612,272, to to Karl R. Erickson et al., entitled, *Real Time Cognitive Reasoning Using a Circuit With Varying Confidence Level Alerts*, assigned to International Business Machines Corporation, 41 pages, filed Jun. 2, 2017.

U.S. Appl. No. 15/612,360, to to Karl R. Erickson et al., entitled, *Cognitive Analysis Using Applied Analog Circuits*, assigned to International Business Machines Corporation, 37 pages, filed Jun. 2, 2017.

U.S. Appl. No. 15/612,316, to to Karl R. Erickson et al., entitled, *Optimizing Data Approximation Analysis Using Low Power Circuitry*, assigned to International Business Machines Corporation, 34 pages, filed Jun. 2, 2017.

U.S. Appl. No. 15/892,037, to Karl R. Erickson et al., entitled, *Predicting Data Correlation Using Multivalued Logical Outputs in Static Random Access Memory (SRAM) Storage Cells*, assigned to International Business Machines Corporation, 24 pages, filed Feb. 28, 2018.

U.S. Appl. No. 15/822,479, to Karl R. Erickson et al., entitled, *Optimizing Data Approximation Analysis Using Low Power Circuitry*, assigned to International Business Machines Corporation, 28 pages, filed Nov. 27, 2017.

U.S. Appl. No. 15/820,301, to Karl R. Erickson et al., entitled, *Real Time Cognitive Monitoring of Correlations Between Variables*, assigned to International Business Machines Corporation, 34 pages, filed Nov. 21, 2017.

U.S. Appl. No. 15/818,929, to Karl R. Erickson et al., entitled, *Cognitive Analysis Using Applied Analog Circuits*, assigned to International Business Machines Corporation, 31 pages, filed Nov. 21, 2017.

U.S. Appl. No. 15/818,977, to Karl R. Erickson et al., entitled, *Real Time Cognitive Reasoning Using a Circuit With Varying Confidence Level Alerts*, assigned to International Business Machines Corporation, 36 pages, filed Nov. 21, 2017.

AUS820160895US01, Appendix P; List of Patents or Applications Treated as Related, Feb. 27, 2018, 2 pages.

Kozma et al., *A Low-Power Current-Mode Correlation Detector with Analog Data Storage*, 2004 IEEE Region 10 Conference (TENCON 2004), Nov. 2004, vol. 2, pp. 442-445, IEEE Xplore Digital Library (ieee.org) online, DOI: 10.1109/TENCON.2004.1414627, URL: ieeexplore.ieee.org/abstract/document/1414627/.

AUS820160895US01, Appendix P; List of IBM Patent or Applications Treated as Related, Jun. 8, 2017, 2 pages.

Carstens, *Open Bit Line Sensing: Writing Dummy Cells for Test Purpose*, an IP.com Prior Art Database Technical Disclosure, IP.com No. IPCOM000174809D, Qimonda 2008, Original Publication Date: Oct. 13, 2008, 2 pages.

*Voltage Comparator*, Chapter 6—Analog Integrated Circuits, All About Circuits, Electronics Textbook, <https://www.allaboutcircuits.com/textbook/experiments/chpt-6/voltage-comparator/>, EETech Media, LLC, printed Mar. 10, 2017, 3 pages.

U.S. Appl. No. 16/000,207, to to Karl R. Erickson et al., entitled, *Optimizing Data Approximation Analysis Using Low Power Circuitry*, assigned to International Business Machines Corporation, 34 pages, filed Jun. 5, 2018.

U.S. Appl. No. 16/001,420, to to Karl R. Erickson et al., entitled, *Optimizing Data Approximation Analysis Using Low Power Circuitry*, assigned to International Business Machines Corporation, 34 pages, filed Jun. 6, 2018.

AUS820160895US01, Appendix P; List of IBM Patent or Applications Treated as Related, Sep. 14, 2018, 2 pages.

* cited by examiner

REAL TIME COGNITIVE MONITORING OF CORRELATIONS BETWEEN VARIABLES

BACKGROUND

Field of the Invention

The field of the invention is data processing, or, more specifically, methods, apparatus, and products for real time cognitive monitoring of correlations between variables.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for real time cognitive monitoring of correlations between variables are disclosed in this specification. Real time cognitive monitoring of correlations between variables includes receiving, by a circuit, a first set of data results and a second set of data results, wherein each set of data results comprises binary data points; adding a unit of charge to a collection capacitor on the circuit for each of the first set of data results that indicates a positive data point; removing a unit of charge from the collection capacitor for each of the second set of data results that indicates a positive data point; triggering a first sense amp on the circuit if the charge on the collection capacitor exceeds a high charge threshold, indicating that the positive data points in the first set of data results is greater than the positive data points in the second set of data results to a first statistical significance; and triggering a second sense amp on the circuit if the charge on the collection capacitor drops below a low charge threshold, indicating that the positive data points in the second set of data results is greater than the positive data points in the first set of data results to a second statistical significance.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
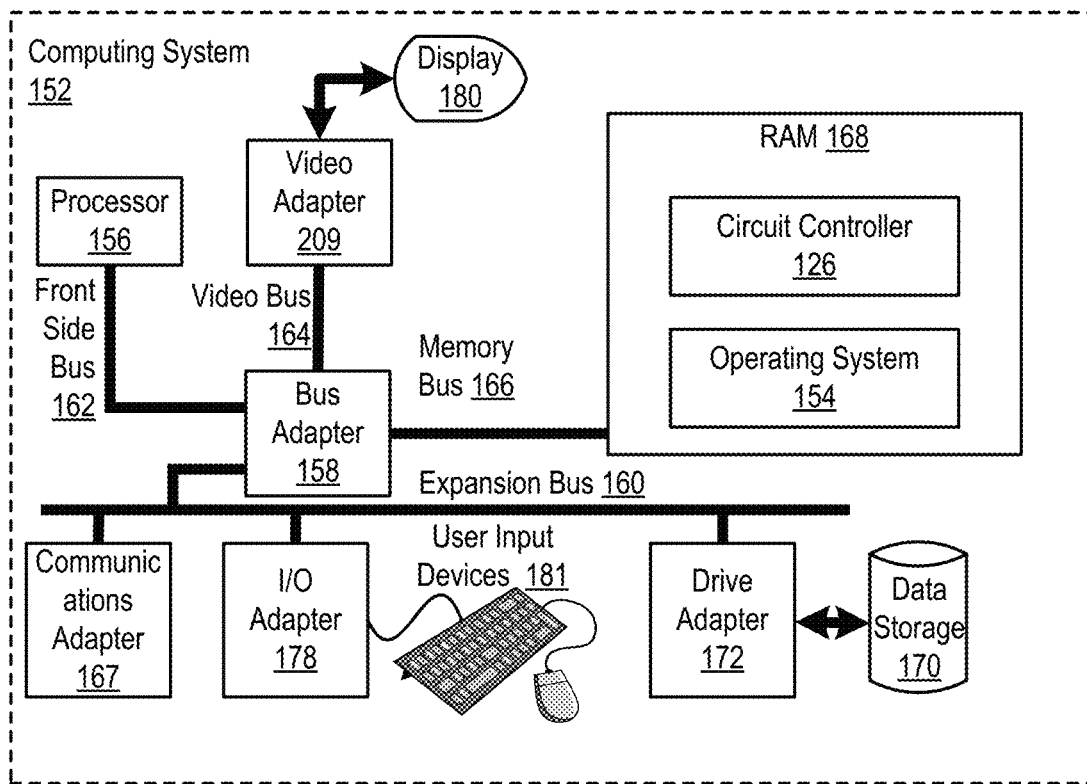
FIG. 1 sets forth a block diagram of an example system configured for real time cognitive monitoring of correlations between variables according to embodiments of the present invention.

Exemplary methods, apparatus, and products for real time cognitive monitoring of correlations between variables in accordance with the present invention are described with reference to the accompanying drawings, beginning with FIG. 1. FIG. 1 sets forth a block diagram of automated computing machinery comprising an exemplary computing system (152) configured for real time cognitive monitoring of correlations between variables according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for real time cognitive monitoring of correlations between variables according to embodiments of the present invention include UNIX™, Linux™, Microsoft XP™, AIX™, IBM's iOS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a circuit controller (126), a module of computer program instructions for real time cognitive monitoring of correlations between variables.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for real time cognitive monitoring of correlations between variables according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for real time cognitive monitoring of correlations between variables according to embodiments of the present invention include modems for wired dial-up communications, Ethernet (IEEE 802.3) adapters for wired data communications, and 802.11 adapters for wireless data communications.

Figure 2:
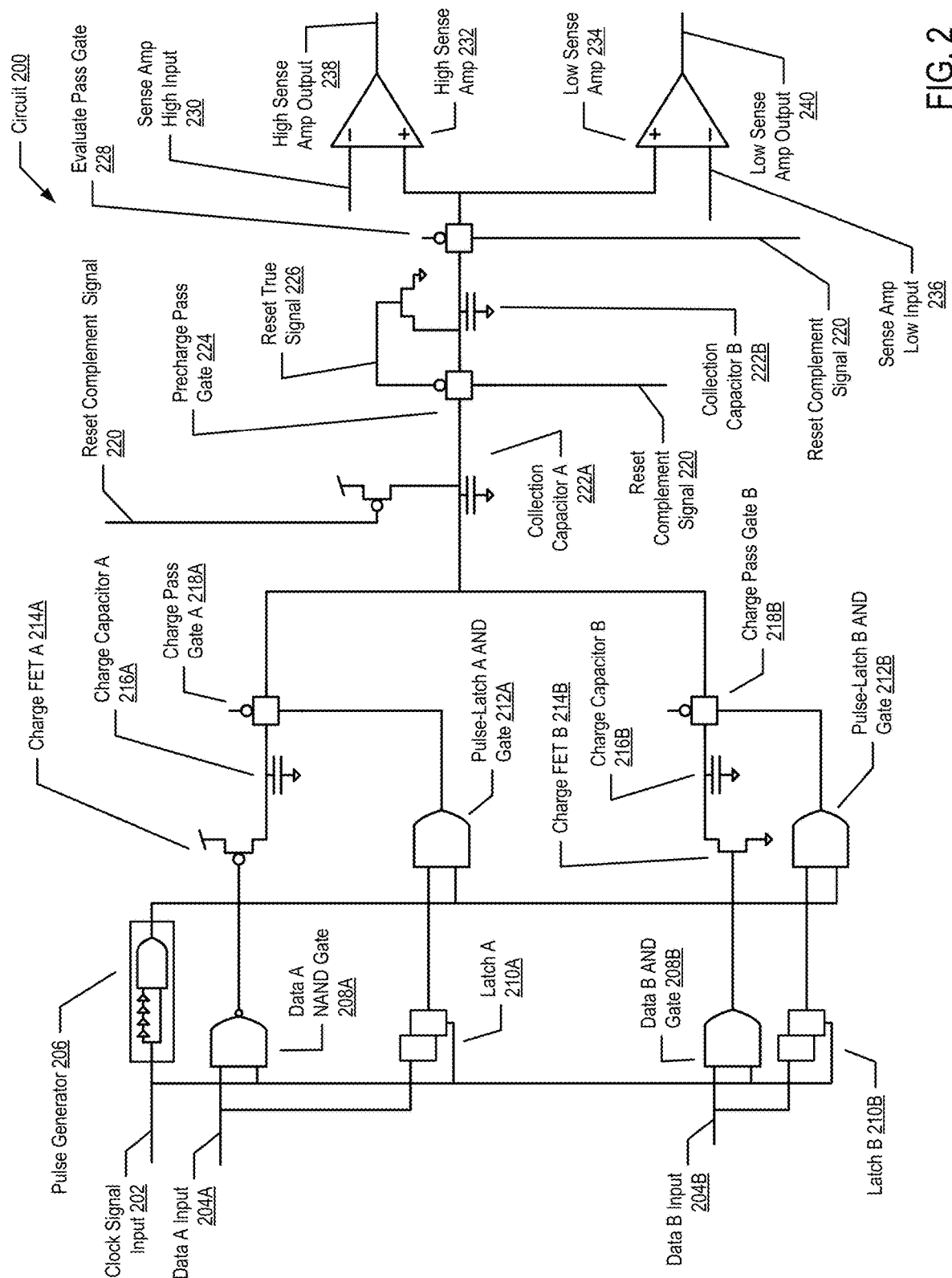
FIG. 2 sets forth a circuit configured for real time cognitive monitoring of correlations between variables according to embodiments of the present invention.

For further explanation, FIG. 2 shows elements of an example circuit (200) configured for real time cognitive monitoring of correlations between variables in accordance with the present invention. As shown in FIG. 2, the exemplary circuit (200) includes a clock signal input (202), a data A input (204A), a data B input (204B), a pulse generator (206), a data A NAND gate (208A), a data B AND gate (208B), a latch A (210A), a latch B (210B), a pulse-latch A AND gate (212A), a pulse-latch B AND gate (212B), a charge FET A (214A), a charge FET B (214B), a charge capacitor A (216A), a charge capacitor B (216B), a charge pass gate A (218A), a charge pass gate B (218B), a reset complement signal (220), a collection capacitor A (222A), a collection capacitor B (222B), a precharge pass gate (224), reset true signal (226), an evaluation pass gate (228), a sense amp high input (230), a high sense amp (232), a low sense amp (234), a sense amp low input (236), a high sense amp output (238), and a low sense amp output (240).

The example circuit, in general, may be configured to receive two sets of binary data via data A input (204A) and data B input (204B). For each positive data point (i.e., '1's or high bits) applied to the data A input (204A), a unit of charge is placed on the collection capacitors (collection capacitor A (222A), collection capacitor B (222B)). For each positive data point (i.e., '1's or high bits) applied to the data B input (204B), a unit of charge is removed from the collection capacitors (collection capacitor A (222A), collection capacitor B (222B)). If the charge on the collection capacitors exceeds a high charge threshold, the high sense amp (232) generates an output on the high sense amp output (238) indicating that the high charge threshold has been exceeded. Similarly, if the charge on the collection capacitors drops below a low charge threshold, the low sense amp (234) generates an output on the low sense amp output (240) indicating that the charge on the collection capacitors has dropped below the low charge threshold.

The clock signal input (202) is a pin or other input wire configured to receive a timed clock pulse as one input into the pulse generator (206), data A NAND gate (208A), data B AND gate (208B), latch A (210A), and latch B (210B). The data inputs (data A input (204A), data B input (204B)) are pins or other input wires configured to receive signals corresponding to the data bits in the set of data results, such as signals corresponding to positive data points, and signals corresponding to a negative data points.

The pulse generator (206) generates a pulse based on the clock signal input (202). The pulse generator (206) may generate a high signal on the falling edge of the clock signal. Specifically, the pulse generator (206) may generate a high signal upon detection that the clock signal is transitioning from high to low.

The latches (latch A (210A), latch B (210B)) are used to store a signal from the data inputs (data A input (204A), data B input (204B)) and provide that signal to the pulse-latch AND gates (pulse-latch A AND gate (212A), pulse-latch B AND gate (212B)). The pulse-latch AND gates (pulse-latch A AND gate (212A), pulse-latch B AND gate (212B)) receive signals from the pulse generator and the latches (latch A (210A), latch B (210B)), and transmit signals to the charge pass gates (charge pass gate A (218A), charge pass gate B (218B)).

The charging FETs (charge FET A (214A), charge FET B (214B)) control the charge placed on the charge capacitors (charge capacitor A (216A), charge capacitor B (216B)). The charge pass gates (charge pass gate A (218A), charge pass gate B (218B)) transfer the charges from the charge capacitors (charge capacitor A (216A), charge capacitor B (216B)) to the collection capacitors (collection capacitor A (222A), collection capacitor B (222B)).

The reset true signal (226) and the reset complement signal (220) are pins or other input wires configured to reset the charge on the collection capacitors (collection capacitor A (222A), collection capacitor B (222B)). The reset true signal (226) and the reset complement signal (220) trigger the reset circuitry on the circuit (200) that discharges the collection capacitors (collection capacitor A (222A), collection capacitor B (222B)), and precharges the collection capacitors to a midpoint voltage. The reset circuitry may be triggered, for example, by a circuit controller based on the high sense amp output (238), the low sense amp output (240), the number of samples received, the number of positive data point results received, or manually by a user.

The precharge pass gate (224) controls the voltage transfer between the collection capacitors during the precharge process. When closed, precharge pass gate (224) allows a voltage to be applied to only one collection capacitor (or one side of the precharge pass gate (224)). When open, the precharge pass gate (224) allows the voltage to transfer from one collection capacitor to another such that the voltages on both collection capacitors equalizes to a midpoint voltage that is half of the voltage applied to the first capacitor (assuming no voltage on the second collection capacitor prior to opening the precharge pass gate (224)). The precharge pass gate (224) may be operated using the reset true signal (226) and the reset complement signal (220).

The evaluate pass gate (228), when open, allows the resulting voltage on the collection capacitors (collection capacitor A (222A), collection capacitor B (222B)) to be evaluated by the sense amps (high sense amp (232), low sense amp (234)). The sense amps (high sense amp (232), low sense amp (234)) compare the resulting voltage to a high charge threshold inputted on the sense amp high input (223) and a low charge threshold inputted on the sense amp low input (236). The sense amps (high sense amp (232), low sense amp (234)) output, on the sense amp outputs (high sense amp output (238), low sense amp output (240)), an indication whether the resulting voltage on the collection capacitors exceeds the sense amp high input (230) or drops below the sense amp low input (236). The sense amps may be any circuit or device able to detect whether a voltage threshold has been crossed. The high sense amp output (238) and the low sense amp output (240) may be detected and read, for example, by a circuit controller.

The high charge threshold on the sense amp high input (230) and the low charge threshold on the sense amp low input (236) may be calculated as a function of a probability range, a confidence level, and a statistically significant number of units of charge. The high charge threshold and the low charge threshold indicate a range of voltages around the midpoint voltage within which the first set of data results and the second set of data results are determined to be equiprobable. Exceeding or dropping below a threshold indicates that the first set of data results or the second set of data results has a greater number of positive data points to a statistical significance.

Statistical significance is a threshold difference between positive data points in the first set of data results and the second set of data results which mathematically indicates that positive data points in the first set of data results and positive data points in the second set of data results are not equiprobable and to what degree. A statistically significant difference between positive data points in the first set of data results and positive data points in the second set of data results indicates that positive data points in one set of data results occurs more frequently than positive data points in the other set of data results, accounting for the order in which the data results are received.

Each threshold is based on a difference in the number of positive data points in the first set of data results and the positive data points in the second set of data results, in terms of a number of units of charge. To determine how many units of charge above a midpoint voltage indicate a statistically significant difference, a probability range is selected based on system requirements, technical considerations, technical specifications, or other factors. A tolerance of unusual events or confidence level is also determined. The tolerance may vary depending on such factors as technical specifications and risk tolerance, but 1%, 5%, and 10% are common. For a given probability, 'p', and range (from 'p0' to 'p' to 'p1') and a confidence level ('alpha' and 'beta'), the following formula may be used to determine a number of units of charge above or below the midpoint voltage that would indicate statistical significance (where 'n' is the total number of positive data points in the sets A and B of data results, and 'y' is the number of positive data points in the first set of data results):

$$\ln(B) < an + by < \ln(A),$$

where $$a = \ln\left(\frac{1-p1}{1-p0}\right), \quad b = \ln\left(\frac{p1}{p0}\right) - a, \quad A = \frac{1-\text{beta}}{\text{alpha}}, \text{ and}$$

$$B = \frac{\text{beta}}{1-\text{alpha}}.$$

Using a probability range of 'p0' equal to 0.45 and 'p' equal to 0.5 and "p1" equal to 0.55, and a confidence level of 'alpha' equal to 10% or 0.10 and 'beta' equal to 10% or 0.10, the results of the formula are as follows:

$$-14.7 < y - (n-y) < 14.7,$$

Note that (n–y) is precisely the number of positive data points in set B of data results. Therefore, in this example, 15 units of charge above or below the midpoint voltage may be selected as indicating a statistical significant difference between positive data points in the first set of data results and positive data points in the second set of data results. If one set of data results has received 15 more positive data points than the other set of data results, an indication is made that there exists a statistically significant difference between the sets of data results. Within the circuit, if there are 15 units of charge above or below the midpoint voltage of the collection capacitor, then the first set of data results or the second set of data results is greater to a statistically significant degree. This formula may be used to calculate a statistically significant number of units of charge regardless of the number of data points anticipated to be received.

Based on the determined units of charge, the ratio of the capacity of the charge capacitors to the collection capacitor may be calculated as a function of circuit voltage and the statistically significant number of units of charge. The following formula may be used to determine the ratio of the capacity of the charge capacitors (Cap2) to the collection capacitor (Cap1), where VDD is the circuit voltage:

$$2 * Cap2 = \left(\frac{\text{\# units of charge}}{\frac{VDD}{2} - (VDD * 0.1)}\right) Cap1$$

Using this formula, a circuit with a circuit voltage of 1.5V and a statistically significant number of units of charge of 15 units, the ratio of each charge capacitor to the collection capacitor would be 12.5. The circuit (200) may then be constructed with appropriately sized capacitors.

Figure 3:
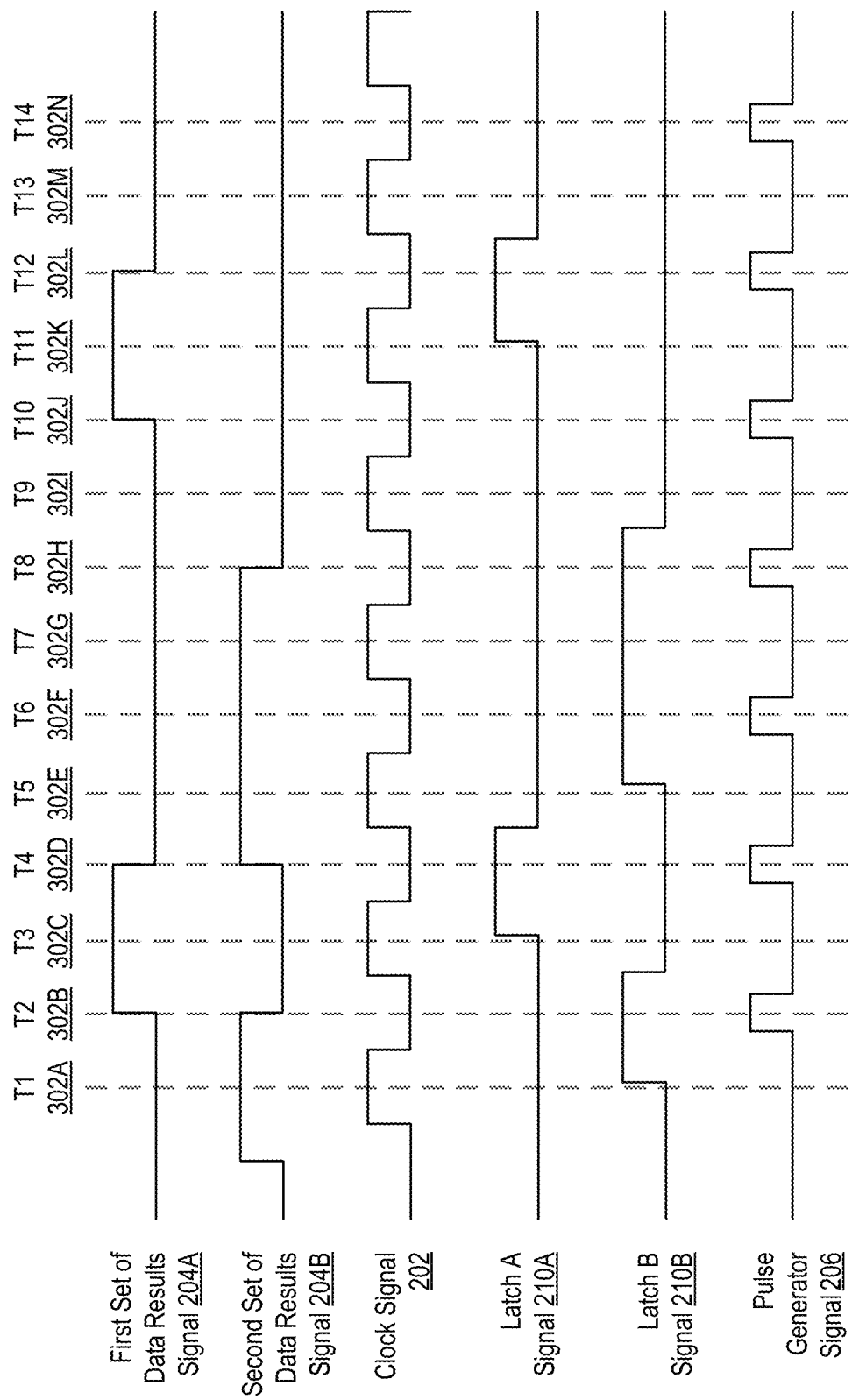
FIG. 3 sets forth a timeline illustrating an exemplary method for real time cognitive monitoring of correlations between variables according to embodiments of the present invention.

For further explanation, FIG. 3 shows an exemplary timeline for real time cognitive monitoring of correlations between variables according to embodiments of the invention. FIG. 3 shows the first set of data results signal (204A) that may be placed on the data A input of the circuit, the second set of data results signal (204B) that may be placed on the data B input of the circuit. FIG. 3 also shows a clock signal (202), a latch A signal (210A), a latch B signal (210B) and a pulse generator signal (206).

At time T1 (302A), a positive data result is received on the second set of data results signal (204B) and the clock signal (202) goes high. In response to the second set of data results signal (204B) and the clock signal (202) going high, the positive data result is stored in latch B (210B) and the charge FET B (214B) is opened, charging charge capacitor B (216B) to ground.

At time T2 (302B), the pulse generator signal (206) is high and the latch B signal (210B) is high, triggering the pulse-latch B AND gate (212B) and opening the charge pass gate B (218B), which transfers the ground charge on charge capacitor B (216B) to the collection capacitors (collection capacitor A (222A), collection capacitor B (222B)).

At time T3 (302C), a positive data result is received on the first set of data results signal (204A) and the clock signal (202) goes high. In response to the first set of data results signal (204A) and the clock signal (202) going high, the positive data result is stored in latch A (210A) and the charge FET A (214A) is opened, charging charge capacitor A (216A) to the circuit voltage.

At time T4 (302D), the pulse generator signal (206) is high and the latch A signal (210A) is high, triggering the pulse-latch A AND gate (212A) and opening the charge pass gate A (218A), which transfers the circuit voltage charge on charge capacitor A (216A) to the collection capacitors (collection capacitor A (222A), collection capacitor B (222B)).

At time T5 (302E), a positive data result is received on the second set of data results signal (204B) and the clock signal (202) goes high. In response to the second set of data results signal (204B) and the clock signal (202) going high, the positive data result is stored in latch B (210B) and the charge FET B (214B) is opened, charging charge capacitor B (216B) to ground.

At time T6 (302F), the pulse generator signal (206) is high and the latch B signal (210B) is high, triggering the pulse-latch B AND gate (212B) and opening the charge pass gate B (218B), which transfers the ground charge on charge capacitor B (216B) to the collection capacitors (collection capacitor A (222A), collection capacitor B (222B)).

At time T7 (302G), a positive data result is received on the second set of data results signal (204B) and the clock signal (202) goes high. In response to the second set of data results signal (204B) and the clock signal (202) going high, the positive data result is stored in latch B (210B) and the charge FET B (214B) is opened, charging charge capacitor B (216B) to ground.

At time T8 (302H), the pulse generator signal (206) is high and the latch B signal (210B) is high, triggering the pulse-latch B AND gate (212B) and opening the charge pass gate B (218B), which transfers the ground charge on charge capacitor B (216B) to the collection capacitors (collection capacitor A (222A), collection capacitor B (222B)).

At time T9 (302I), the clock is high, but no positive data result is received on either the first set of data results signal (204A) or the second set of data results signal (204B). Therefore, no signal is stored in either latch (latch A (210A), latch B (210B)) and neither charge FET (charge FET A (214A), charge FET B (214B)) is opened.

At time T10 (302J), the pulse generator signal (206) is high, but neither latch signal (latch A signal (210A), latch B signal (210B)) is high, so neither AND gate (pulse-latch A AND gate (212A), pulse-latch B AND gate (212B)) is triggered, and neither charge pass gate (charge pass gate A (218A), charge pass gate B (218B)) is opened.

At time T11 (302K), a positive data result is received on the first set of data results signal (204A) and the clock signal (202) goes high. In response to the first set of data results signal (204A) and the clock signal (202) going high, the positive data result is stored in latch A (210A) and the charge FET A (214A) is opened, charging charge capacitor A (216A) to the circuit voltage.

At time T12 (302L), the pulse generator signal (206) is high and the latch A signal (210A) is high, triggering the pulse-latch A AND gate (212A) and opening the charge pass gate A (218A), which transfers the circuit voltage charge on charge capacitor A (216A) to the collection capacitors (collection capacitor A (222A), collection capacitor B (222B)).

At time T13 (302M), the clock is high, but no positive data result is received on either the first set of data results signal (204A) or the second set of data results signal (204B). Therefore, no signal is stored in either latch (latch A (210A), latch B (210B)) and neither charge FET (charge FET A (214A), charge FET B (214B)) is opened.

At time T14 (302N), the pulse generator signal (206) is high, but neither latch signal (latch A signal (210A), latch B signal (210B)) is high, so neither AND gate (pulse-latch A AND gate (212A), pulse-latch B AND gate (212B)) is triggered, and neither charge pass gate (charge pass gate A (218A), charge pass gate B (218B)) is opened.

Figure 4:
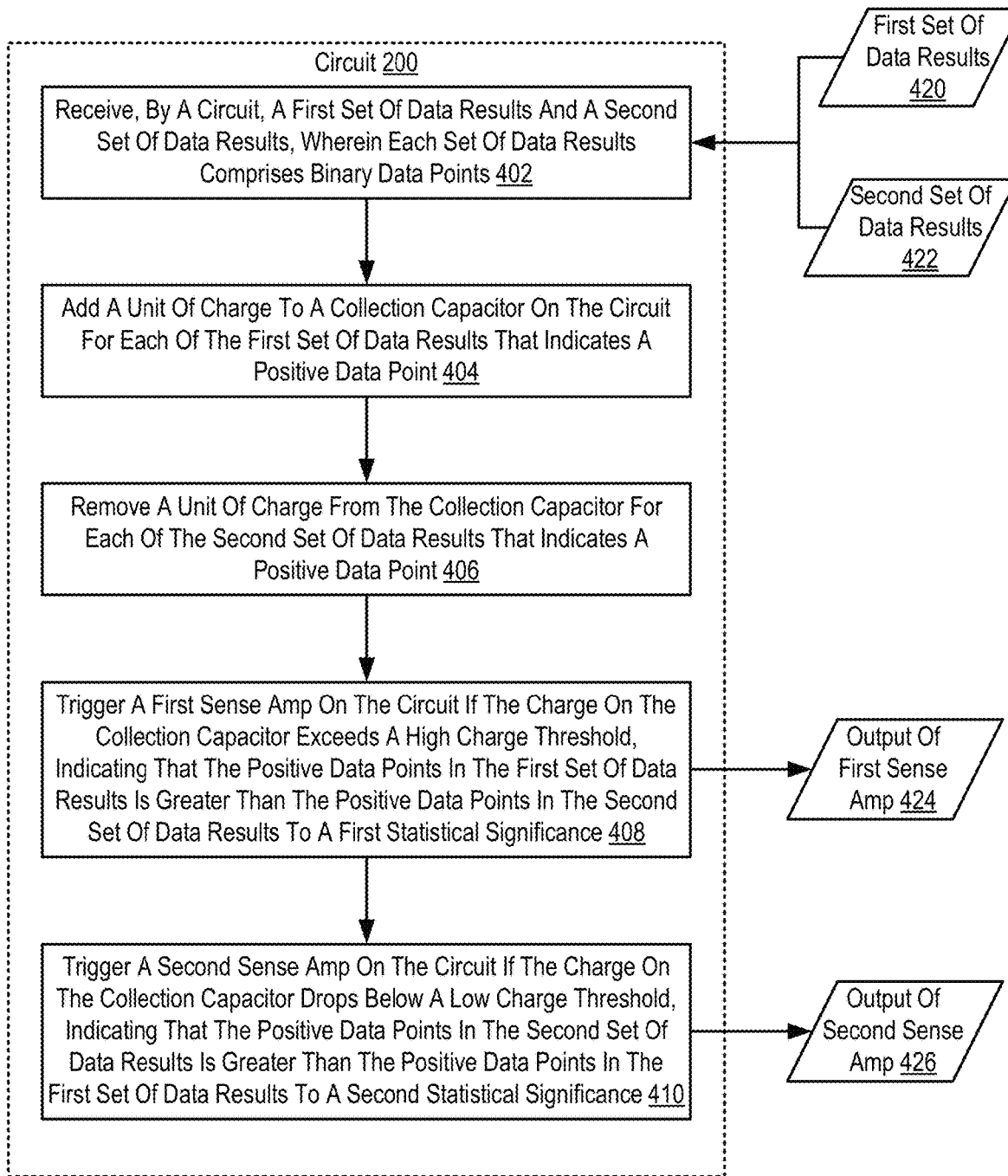
FIG. 4 sets forth a flow chart illustrating an exemplary method for real time cognitive monitoring of correlations between variables according to embodiments of the present invention.

For further explanation, FIG. 4 sets forth a flow chart illustrating an exemplary method for real time cognitive monitoring of correlations between variables according to embodiments of the present invention that includes receiving (402), by a circuit (200), a first set of data results (420) and a second set of data results (422), wherein each set of data results comprises binary data points. Receiving (402), by a circuit (200), a first set of data results (420) and a second set of data results (422), wherein each set of data results comprises binary data points may be carried out by applying the first set of data results (420) to a first data input of the circuit and the second set of data results (422) to a second data input of the circuit. Each set of data results (first set of data results (420), second set of data results (422)) may indicate a type of relationship between two or more tests performed under the same conditions. Specifically, the positive data points in the first set of data results indicate a first type of relationship between a first test and a second test, and wherein the positive data points in the second set of data results indicate a second type of relationship between the first test and the second test. Further, the first data point in each of the first set of data results and the second set of data results refers to the relationship between different tests performed under the same conditions (e.g., test performed on the same die).

For example, a set of non-yielding dies may undergo tests to determine whether certain circuits within the die match the specification for the die. Test 1 may be to determine whether a resistance for "via1" matches the specification, and test 2 may be to determine whether a resistance for "m1" matches the specification. Given the two tests, there are four types of relationships possible between test 1 and test 2: test 1 fails and test 2 fails (0,0), test 1 fails and test 2 passes (0,1), test 1 passes and test 2 fails (1,0), and test 1 passes and test 2 passes (1,1). For each die, one of the four relationships will result from the results of test 1 and test 2.

Given the four test relationships, data results can be generated. Data result A determines whether "via1" resistance and m1 resistance are both out of spec (i.e., is the test 1/test 2 relationship equal to (0,0)). Data result B determines whether "via1" resistance is out of spec and m1 resistance is in spec (i.e., is the test 1/test 2 relationship equal to (0,1)). Data result C determines whether "via1" resistance is in spec and "m1" resistance is out of spec (i.e., is the test 1/test 2 relationship equal to (1,0)). Data result D determines whether "via1" resistance and "m1" resistance are both in spec (i.e., is the test 1/test 2 relationship equal to (1,1)). Data result D may be ignored because the occurrence of both test 1 and test 2 passing may not be relevant to determining correlations between failing tests on non-yielding dies.

For each test1/test2 relationship, each data result will have corresponding results. For the test1/test2 relationship (0,0), data result A will be '1' (positive), data result B will be '0' (negative), data result C will be '0' (negative), and data result D will be '0' (negative). For the test1/test2 relationship (0,1), result A will be '0' (negative), data result B will be '1' (positive), data result C will be '0' (negative), and data result D will be '0' (negative). For the test1/test2 relationship (1,0), data result A will be '0' (negative), data result B will be '0' (negative), data result C will be '1' (positive), and data result D will be '0' (negative). Finally, for the test1/test2 relationship (1,1), data result A will be '0' (negative), data result B will be '0' (negative), data result C will be '0' (negative), and data result D will be '1' (positive). The above example may be summarized using the following table:

TABLE 1

| Test 1 | Test 2 | Data Result A | Data Result B | Data Result C | Data Result D |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The circuit may be utilized to determine (very quickly and using little power) whether one data result occurs more frequently to a statistically significant degree than another data result. To that end, if two tests are performed on each of a set of conditions (e.g., a set of dies or computer chips), three comparisons may be made using the circuit: data result A compared to data result B, data result A compared to data result C, and data result B compared to data result C. Once again, Data result D may be ignored because the occurrence of both test 1 and test 2 passing may not be relevant to determining correlations between failing tests on non-yielding dies.

The method of FIG. 4 also includes adding (404) a unit of charge to a collection capacitor on the circuit (200) for each of the first set of data results (420) that indicates a positive data point. Adding (404) a unit of charge to a collection capacitor on the circuit (200) for each of the first set of data results (420) that indicates a positive data point may be carried out by generating a positive unit of charge and transferring that unit of charge to the one or more collection capacitors. The unit of charge may be generated by charging a charge capacitor to a certain voltage, such as the circuit voltage, and opening a switch such as a pass gate that transfers the charge to the collection capacitor. The collection capacitor may be more than one capacitor operating a single capacitor.

The method of FIG. 4 also includes removing (406) a unit of charge from the collection capacitor for each of the second set of data results (422) that indicates a positive data point. Removing (406) a unit of charge from the collection capacitor for each of the second set of data results (422) that indicates a positive data point may be carried out by generating a negative unit of charge and transferring that negative unit of charge to the one or more collection capacitors. The negative unit of charge may be generated by charging a charge capacitor to ground and opening a switch such as a pass gate that transfers the negative charge to the collection capacitor.

Each unit of charge may be equal, or nearly equal, to all other units of charge. Specifically, the unit of charge removed from the collection capacitor may be equivalent to a unit of charge added to the collection capacitor. Further, a negative unit of charge may have the same magnitude of a positive unit of charge, such that if one positive unit of charge and one negative unit of charge are transferred to a collection capacitor at a midpoint voltage, the resulting voltage on the collection capacitor will be the midpoint voltage.

The method of FIG. 4 also includes triggering (408) a first sense amp on the circuit if the charge on the collection capacitor exceeds a high charge threshold, indicating that the positive data points in the first set of data results (420) is greater than the positive data points in the second set of data results (422) to a first statistical significance. Triggering (408) a first sense amp on the circuit if the charge on the collection capacitor exceeds a high charge threshold, indicating that the positive data points in the first set of data results (420) is greater than the positive data points in the second set of data results (422) to a first statistical significance may be carried out by comparing the charge on the collection capacitor to a voltage on the sense amp high input. Triggering (408) the first sense amp and generating an indication on the output of the first sense amp (424) may be carried out by placing a signal on the high sense amp output indicating that the sense amp high input has been exceeded by the input from the collection capacitor.

The high charge threshold may be a voltage applied to a sense amp high input. Further, the high charge threshold may be equivalent to the midpoint voltage combined with the statistically significant number of units of charge. Exceeding the high charge threshold indicates that the charge on the collection capacitor is at least as high as the midpoint voltage combined with the statically significant number of units of charge.

The method of FIG. 4 also includes triggering (410) a second sense amp on the circuit (200) if the charge on the collection capacitor drops below a low charge threshold, indicating that the positive data points in the second set of data results (422) is greater than the positive data points in the first set of data results (420) to a second statistical significance. Triggering (410) a second sense amp on the circuit (200) if the charge on the collection capacitor drops below a low charge threshold, indicating that the positive data points in the second set of data results (422) is greater than the positive data points in the first set of data results (420) to a second statistical significance may be carried out by comparing the charge on the collection capacitor to a voltage on the sense amp low input. Triggering (410) the second sense amp and generating an indication on the output of the second sense amp (426) may be carried out by placing a signal on the low sense amp output indicating that the input from the collection capacitor has dropped below the sense amp low input.

The low charge threshold may be a voltage applied to a sense amp low input. Further, the low charge threshold may be equivalent to the midpoint voltage minus the statistically significant number of units of charge. Dropping below the low charge threshold indicates that the charge on the collection capacitor is at least as low as the midpoint voltage minus the statically significant number of units of charge. The first statistical significance may be equivalent to the second statistical significance. Specifically, a number of units of charge representing the first statistical significance may be equal to the number of units of charge representing the second statistical significance.

As an example, a circuit (200) may be used to determine whether the occurrence of dies in which "via1" resistance is out of spec and m1 resistance is in spec (first set of data results (420)) is equiprobable to the occurrence of dies in which "via1" resistance is in spec and "m1" resistance is out of spec (second set of data results (422)). A probability range of 0.45 to 0.55 may be used with a tolerance of unusual events of 10%. Based on these values, 15 units of charge may be determined to be statistically significant.

As the first set of data results and the second set of data results are applied to the circuit (200) assume that at some point, the circuit (200) has received 2010 positive data points in the first set of data results and 2026 positive data points in the second set of data results. Therefore, the charge on the collection capacitor may be 15 units of charge below a midpoint voltage, dropping below the low charge threshold. Consequently, the second sense amp is triggered, and an indication is placed on the output of the second sense amp.

Figure 5:
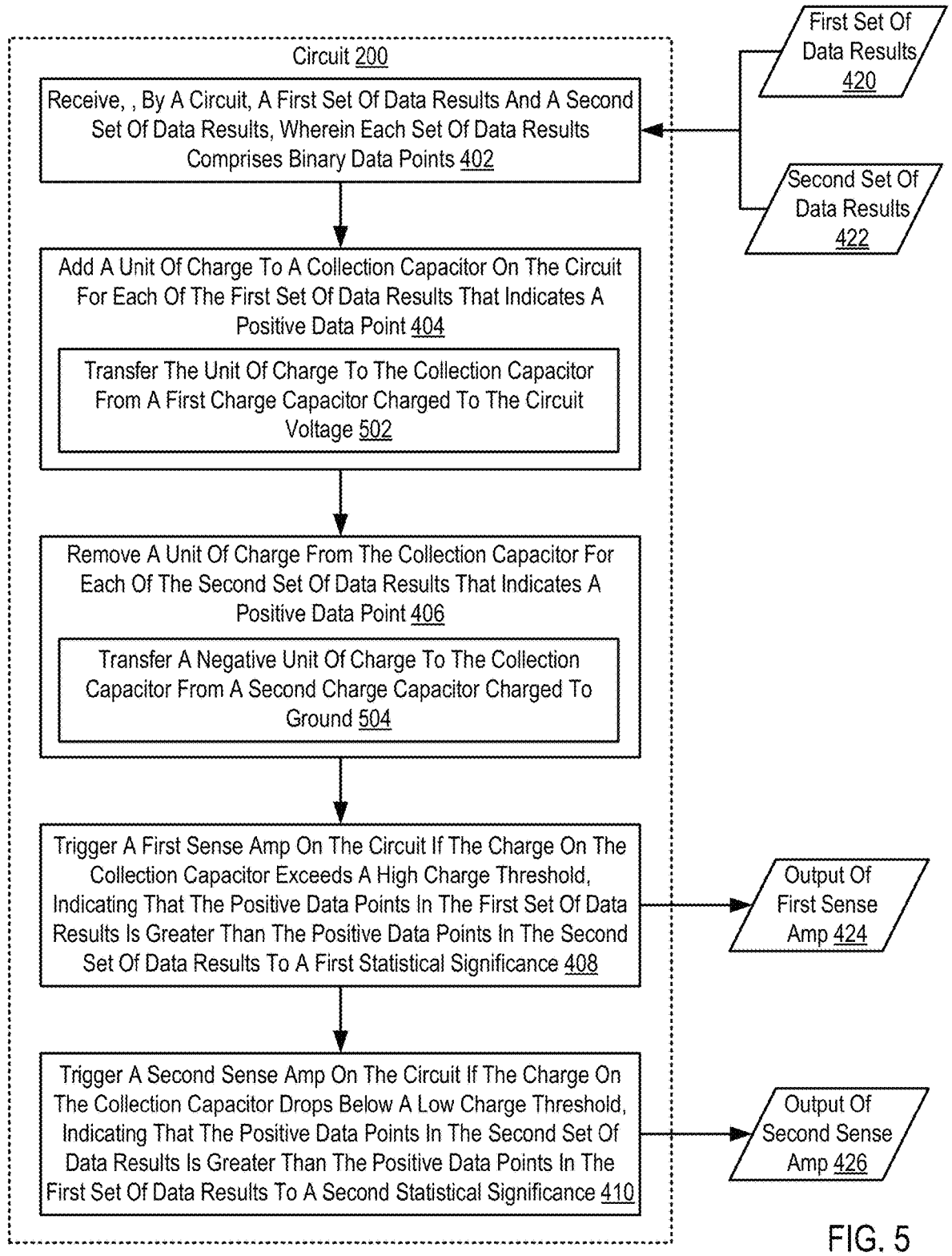
FIG. 5 sets forth a flow chart illustrating an exemplary method for real time cognitive monitoring of correlations between variables according to embodiments of the present invention.

For further explanation, FIG. 5 sets forth a flow chart illustrating a further exemplary method for real time cognitive monitoring of correlations between variables according to embodiments of the present invention that includes receiving (402), by a circuit (200), a first set of data results (420) and a second set of data results (422), wherein each set of data results comprises binary data points; adding (404) a unit of charge to a collection capacitor on the circuit (200) for each of the first set of data results (420) that indicates a positive data point; removing (406) a unit of charge from the collection capacitor for each of the second set of data results (422) that indicates a positive data point; triggering (408) a first sense amp on the circuit if the charge on the collection capacitor exceeds a high charge threshold, indicating that the positive data points in the first set of data results (420) is greater than the positive data points in the second set of data results (422) to a first statistical significance; and triggering (410) a second sense amp on the circuit (200) if the charge on the collection capacitor drops below a low charge threshold, indicating that the positive data points in the second set of data results (422) is greater than the positive data points in the first set of data results (420) to a second statistical significance.

The method of FIG. 5 differs from the method of FIG. 4, however, in that adding (404) a unit of charge to a collection capacitor on the circuit (200) for each of the first set of data results (420) that indicates a positive data point includes transferring (502) the unit of charge to the collection capacitor from a first charge capacitor charged to the circuit voltage. Transferring (502) the unit of charge to the collection capacitor from a first charge capacitor charged to the circuit voltage may be carried out by activating a FET attached to the first charge capacitor, allowing a circuit voltage to charge the first charge capacitor, and subsequently activating a pass gate to transfer the charge from the first charge capacitor to the collection capacitor.

The method of FIG. 5 also differs from the method of FIG. 4, however, in that removing (406) a unit of charge from the collection capacitor for each of the second set of data results (422) that indicates a positive data point includes transferring (504) a negative unit of charge to the collection capacitor from a second charge capacitor charged to ground. Transferring (504) a negative unit of charge to the collection capacitor from a second charge capacitor charged to ground may be carried out by activating a FET attached to the second charge capacitor, allowing the second charge capacitor to charge to ground, and subsequently activating a pass gate to transfer the ground charge from the second charge capacitor to the collection capacitor.

Figure 6:
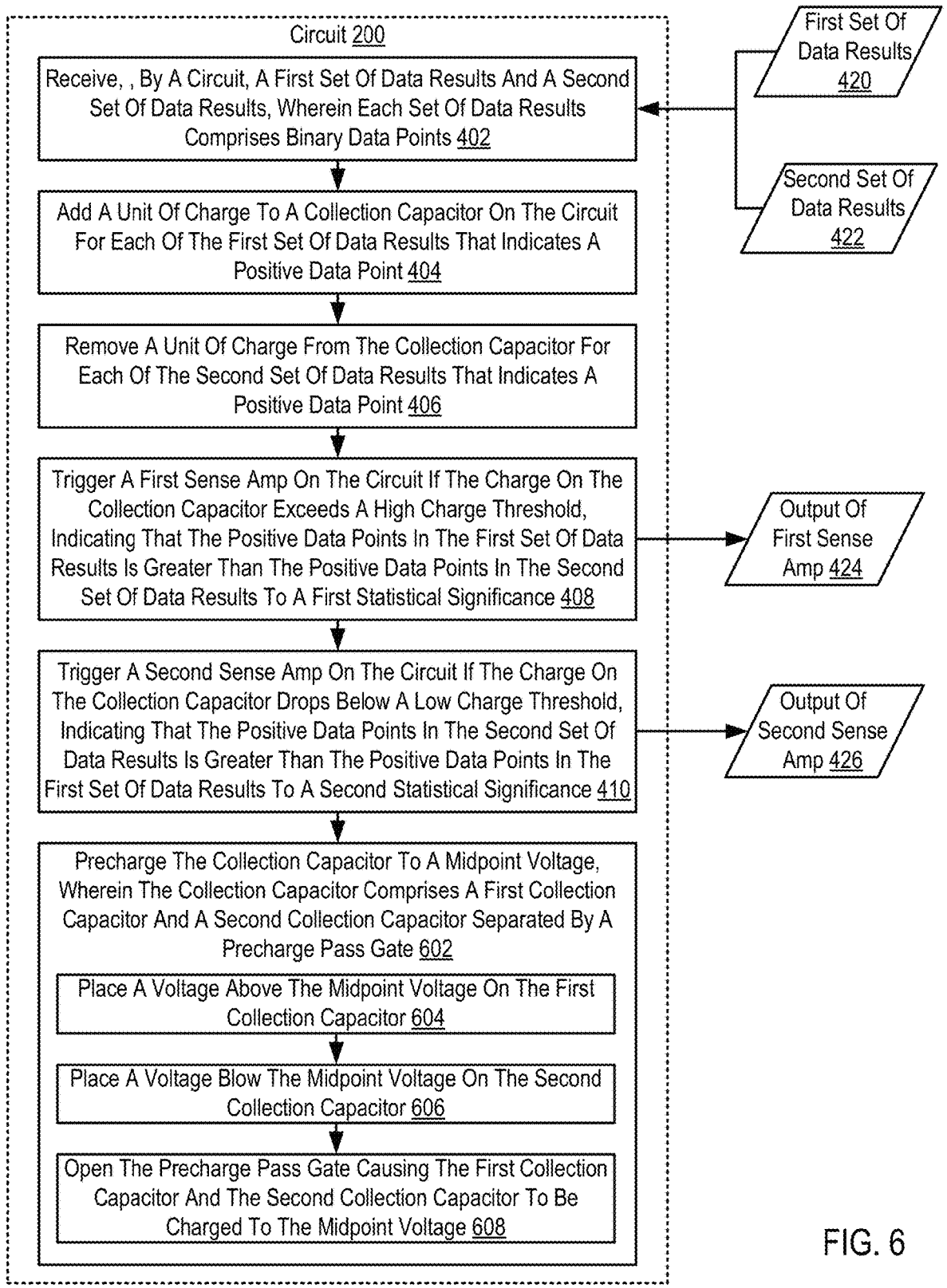
FIG. 6 sets forth a flow chart illustrating an exemplary method for real time cognitive monitoring of correlations between variables according to embodiments of the present invention.

For further explanation, FIG. 6 sets forth a flow chart illustrating a further exemplary method for real time cognitive monitoring of correlations between variables according to embodiments of the present invention that includes receiving (402), by a circuit (200), a first set of data results (420) and a second set of data results (422), wherein each set of data results comprises binary data points; adding (404) a unit of charge to a collection capacitor on the circuit (200) for each of the first set of data results (420) that indicates a positive data point; removing (406) a unit of charge from the collection capacitor for each of the second set of data results (422) that indicates a positive data point; triggering (408) a first sense amp on the circuit if the charge on the collection capacitor exceeds a high charge threshold, indicating that the positive data points in the first set of data results (420) is greater than the positive data points in the second set of data results (422) to a first statistical significance; and triggering (410) a second sense amp on the circuit (200) if the charge on the collection capacitor drops below a low charge threshold, indicating that the positive data points in the second set of data results (422) is greater than the positive data points in the first set of data results (420) to a second statistical significance.

The method of FIG. 6 differs from the method of FIG. 4, however, in that FIG. 6 further includes precharging (602) the collection capacitor to a midpoint voltage, wherein the collection capacitor comprises a first collection capacitor and a second collection capacitor separated by a precharge pass gate. Precharging (602) the collection capacitor to a midpoint voltage includes placing (604) a voltage above the midpoint voltage on the first collection capacitor; placing (606) a voltage blow the midpoint voltage on the second collection capacitor; and opening (608) the precharge pass gate causing the first collection capacitor and the second collection capacitor to be charged to the midpoint voltage.

Placing (604) a voltage above the midpoint voltage on the first collection capacitor may be carried out by closing the precharge pass gate and the evaluate pass gate, and charging the first collection capacitor to a voltage that is twice the desired midpoint voltage. Placing (606) a voltage below the midpoint voltage on the second collection capacitor may be carried out by charging the second capacitor to ground.

Opening (608) the precharge pass gate causing the first collection capacitor and the second collection capacitor to be charged to the midpoint voltage may be carried out by setting the precharge pass gate to low allowing the voltage from the first collection capacitor to charge the second collection capacitor. The first collection capacitor and the second collection capacitor will equalize at one half the charge placed on the first collection capacitor, assuming the second collection capacitor is charged to ground. The midpoint voltage may be an initial charge of the collection capacitor. The midpoint voltage may be a charge between a maximum charge on the collection capacitor and a charge to ground.

Figure 7:
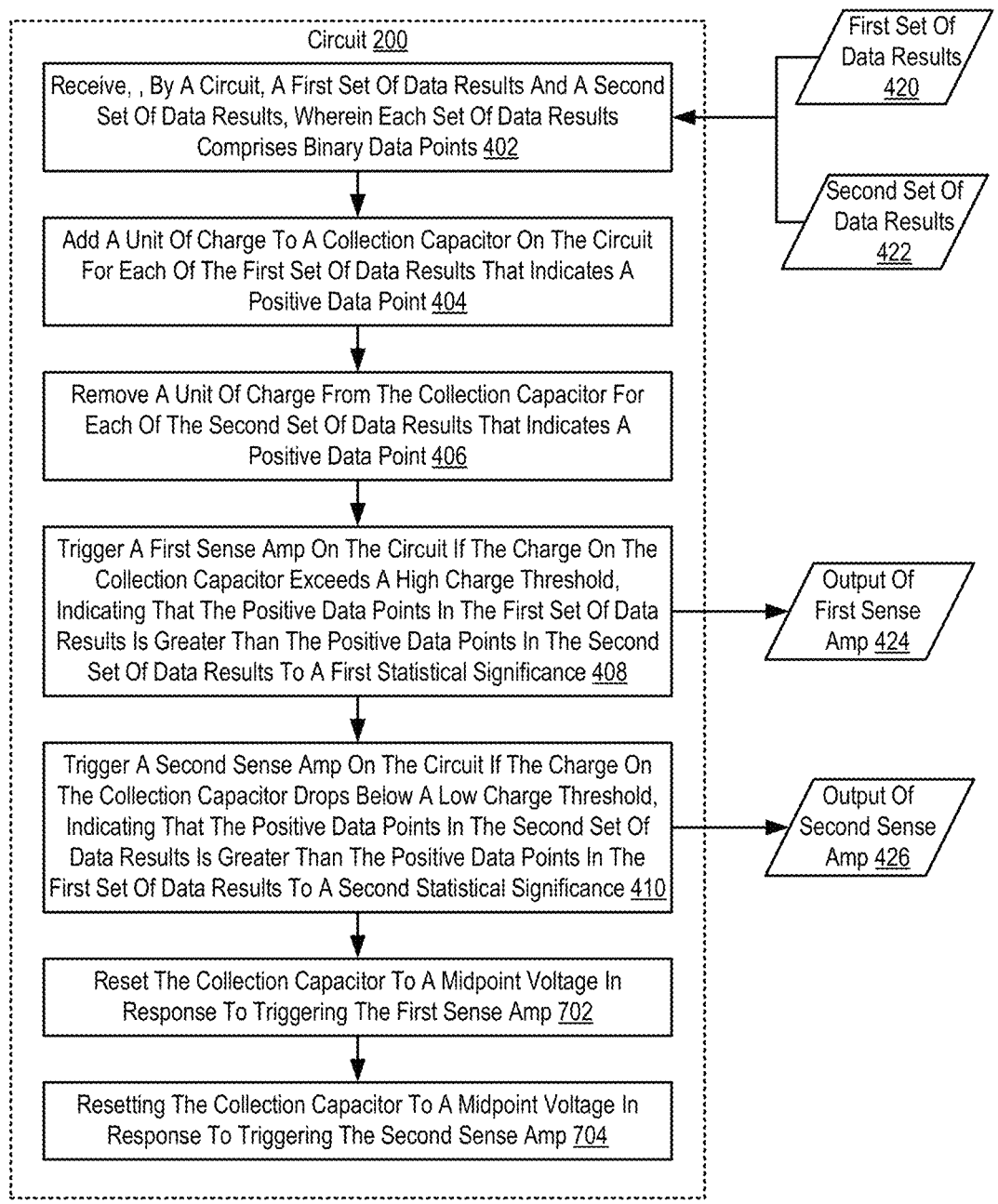
FIG. 7 sets forth a flow chart illustrating an exemplary method for real time cognitive monitoring of correlations between variables according to embodiments of the present invention.

For further explanation, FIG. 7 sets forth a flow chart illustrating a further exemplary method for real time cognitive monitoring of correlations between variables according to embodiments of the present invention that includes receiving (402), by a circuit (200), a first set of data results (420) and a second set of data results (422), wherein each set of data results comprises binary data points; adding (404) a unit of charge to a collection capacitor on the circuit (200) for each of the first set of data results (420) that indicates a positive data point; removing (406) a unit of charge from the collection capacitor for each of the second set of data results (422) that indicates a positive data point; triggering (408) a first sense amp on the circuit if the charge on the collection capacitor exceeds a high charge threshold, indicating that the positive data points in the first set of data results (420) is greater than the positive data points in the second set of data results (422) to a first statistical significance; and triggering (410) a second sense amp on the circuit (200) if the charge on the collection capacitor drops below a low charge threshold, indicating that the positive data points in the second set of data results (422) is greater than the positive data points in the first set of data results (420) to a second statistical significance.

The method of FIG. 7 differs from the method of FIG. 4, however, in that FIG. 7 further includes resetting (702) the collection capacitor to a midpoint voltage in response to triggering the first sense amp; and resetting (704) the collection capacitor to a midpoint voltage in response to triggering the second sense amp. Resetting (702) the collection capacitor to a midpoint voltage in response to triggering the first sense amp may be carried out by detecting an output on the first sense amp indicating that the high charge threshold has been exceeded, discharging the collection capacitor, and precharging the collection capacitor to a midpoint voltage.

Resetting (704) the collection capacitor to a midpoint voltage in response to triggering the second sense amp may be carried out by detecting an output on the second sense amp indicating that the charge on the collection capacitor has dropped below a low charge threshold, discharging the collection capacitor, and precharging the collection capacitor to a midpoint voltage.

In view of the explanations set forth above, readers will recognize that the benefits of real time cognitive monitoring of correlations between variables according to embodiments of the present invention include:

Utilizing custom circuits to perform near-real-time analysis of test results that is orders of magnitude more efficient than traditional methods and requires less time.

Utilizing custom circuits to quickly and efficiently evaluate large amounts of data to approximate trends and flag anomalies, increasing data evaluation efficiency.

Utilizing custom circuits to quickly and efficiently flag statistically significant differences in received data results without requiring knowledge of the total number of samples.

Exemplary embodiments of the present invention are described largely in the context of a fully functional computer system for real time cognitive monitoring of correlations between variables. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for real time cognitive monitoring of correlations between variables, the apparatus comprising a circuit configured to carry out the steps of:

receiving, by a circuit, a first set of data results and a second set of data results, wherein each set of data results comprises binary data points;

adding a unit of charge to a collection capacitor on the circuit for each of the first set of data results that indicates a positive data point;

removing a unit of charge from the collection capacitor for each of the second set of data results that indicates a positive data point;

triggering a first sense amp on the circuit if the charge on the collection capacitor exceeds a high charge threshold, wherein an output of the first sense amp indicates that the positive data points in the first set of data results is greater than the positive data points in the second set of data results to a first statistical significance; and triggering a second sense amp on the circuit if the charge on the collection capacitor drops below a low charge threshold, wherein an output of the second sense amp indicates that the positive data points in the second set of data results is greater than the positive data points in the first set of data results to a second statistical significance.

2. The apparatus of claim 1, wherein adding the unit of charge to the collection capacitor comprises transferring the unit of charge to the collection capacitor from a first charge capacitor charged to the circuit voltage; and wherein removing the unit of charge to the collection capacitor comprises transferring a negative unit of charge to the collection capacitor from a second charge capacitor charged to ground.

3. The apparatus of claim 2, wherein the ratio of the capacity of the charge capacitors to the collection capacitor is a function of circuit voltage and a statistically significant number of units of charge.

4. The apparatus of claim 1, wherein the high charge threshold is a function of a first probability range, a first confidence level, and a first statistically significant number of units of charge; and wherein the low charge threshold is a function of a second probability range, a second confidence level, and a second statistically significant number of units of charge.

5. The apparatus of claim 1, the circuit further configured to carry out the steps of:

precharging the collection capacitor to a midpoint voltage, wherein the collection capacitor comprises a first collection capacitor and a second collection capacitor separated by a precharge pass gate, and wherein precharging the collection capacitor to the midpoint voltage comprises:

placing a voltage above the midpoint voltage on the first collection capacitor;

placing a voltage below the midpoint voltage on the second collection capacitor; and opening the precharge pass gate causing the first collection capacitor and the second collection capacitor to be charged to the midpoint voltage.

6. The apparatus of claim 1, the circuit further configured to carry out the steps of:

resetting the collection capacitor to a midpoint voltage in response to triggering the first sense amp; and resetting the collection capacitor to a midpoint voltage in response to triggering the second sense amp.

7. The apparatus of claim 1, wherein the positive data points in the first set of data results indicate a first type of relationship between a first test result and a second test result, and wherein the positive data points in the second set of data results indicate a second type of relationship between the first test result and the second test result.

8. A computer program product for real time cognitive monitoring of correlations between variables, the computer program product disposed upon a computer readable medium, the computer program product comprising computer program instructions that, when executed, cause a computer to carry out the steps of:
receiving, by a circuit, a first set of data results and a second set of data results, wherein each set of data results comprises binary data points;
adding a unit of charge to a collection capacitor on the circuit for each of the first set of data results that indicates a positive data point;
removing a unit of charge from the collection capacitor for each of the second set of data results that indicates a positive data point;
triggering a first sense amp on the circuit if the charge on the collection capacitor exceeds a high charge threshold, wherein an output of the first sense amp indicates that the positive data points in the first set of data results is greater than the positive data points in the second set of data results to a first statistical significance; and
triggering a second sense amp on the circuit if the charge on the collection capacitor drops below a low charge threshold, wherein an output of the second sense amp indicates that the positive data points in the second set of data results is greater than the positive data points in the first set of data results to a second statistical significance.

9. The computer program product of claim 8,
wherein adding the unit of charge to the collection capacitor comprises transferring the unit of charge to the collection capacitor from a first charge capacitor charged to the circuit voltage; and
wherein removing the unit of charge to the collection capacitor comprises transferring a negative unit of charge to the collection capacitor from a second charge capacitor charged to ground.

10. The computer program product of claim 9, wherein the ratio of the capacity of the charge capacitors to the collection capacitor is a function of circuit voltage and a statistically significant number of units of charge.

11. The computer program product of claim 8,
wherein the high charge threshold is a function of a first probability range, a first confidence level, and a first statistically significant number of units of charge; and
wherein the low charge threshold is a function of a second probability range, a second confidence level, and a second statistically significant number of units of charge.

12. The computer program product of claim 8, wherein the computer program instructions, when executed, further cause a computer to carry out the steps of:
precharging the collection capacitor to a midpoint voltage, wherein the collection capacitor comprises a first collection capacitor and a second collection capacitor separated by a precharge pass gate, and wherein precharging the collection capacitor to the midpoint voltage comprises:
placing a voltage above the midpoint voltage on the first collection capacitor;
placing a voltage below the midpoint voltage on the second collection capacitor; and
opening the precharge pass gate causing the first collection capacitor and the second collection capacitor to be charged to the midpoint voltage.

13. The computer program product of claim 8, wherein the computer program instructions, when executed, further cause a computer to carry out the steps of:
resetting the collection capacitor to a midpoint voltage in response to triggering the first sense amp; and
resetting the collection capacitor to a midpoint voltage in response to triggering the second sense amp.

\* \* \* \* \*